United States Patent
Pelley

(10) Patent No.: US 7,902,915 B2
(45) Date of Patent: Mar. 8, 2011

(54) METHOD AND CIRCUIT FOR CHARGING AND DISCHARGING A CIRCUIT NODE

(75) Inventor: Perry H. Pelley, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 12/479,940

(22) Filed: Jun. 8, 2009

(65) Prior Publication Data

US 2010/0308900 A1 Dec. 9, 2010

(51) Int. Cl.
*G05F 1/10* (2006.01)
(52) U.S. Cl. .......................... 327/544; 327/536
(58) Field of Classification Search ............ 327/535, 327/536, 544
See application file for complete search history.

(56) References Cited

U.S. PATENT DOCUMENTS

| | | | |
|---|---|---|---|
| 5,768,116 A | 6/1998 | Kompelien | |
| 6,154,088 A * | 11/2000 | Chevallier et al. | 327/536 |
| 6,411,531 B1 | 6/2002 | Nork et al. | |
| 7,019,576 B1 | 3/2006 | Sancheti | |
| 7,116,154 B2 * | 10/2006 | Guo | 327/536 |
| 7,253,676 B2 | 8/2007 | Fukuda | |
| 7,439,793 B2 * | 10/2008 | Lee | 327/536 |
| 7,489,566 B2 | 2/2009 | Kang | |
| 7,551,507 B2 | 6/2009 | Nakai | |
| 7,649,402 B1 * | 1/2010 | Chen | 327/536 |
| 2008/0116970 A1 | 5/2008 | Asam | |
| 2008/0157852 A1 | 7/2008 | Pan | |
| 2008/0164933 A1 | 7/2008 | Gschwind et al. | |
| 2008/0239838 A1 | 10/2008 | Chi et al. | |
| 2008/0253215 A1 | 10/2008 | Akiba et al. | |

FOREIGN PATENT DOCUMENTS

JP   2001-268894   9/2001

OTHER PUBLICATIONS

PCT Application No. PCT/US2010/034544; Search Report and Written Opinion dated Jun. 28, 2010.
Trescases, Oliver et al.; "Variable Output, Soft Switching DC/DC Converter for VLSI Dynanic Voltage Sealing Power Supply Applications"; 2004 35th Annual IEEE Power Electronics Specialists Conference; 2004; pp. 4149-4155; IEEE.
Geng, Li et al.; "A CMOS Hybrid Control Mode DC-DC Buck Converter for Embedded System"; Proceedings of 2004 International Conference on Solid-State and Integrated Circuits Technology; Oct. 18-21, 2004; pp. 1472-1475; vol. 2.; IEEE.
U.S. Appl. No. 12/537,436 filed Aug. 7, 2009.

* cited by examiner

*Primary Examiner* — Jeffrey S Zweizig
(74) *Attorney, Agent, or Firm* — Dan Hill; Charles Bergere; Kim-Marie Vo

(57) ABSTRACT

A voltage circuit and method charges a circuit node to a first predetermined voltage. The first predetermined voltage charged onto the circuit node is used for a first predetermined function during a first time period. A portion of charge from the circuit node is removed to circuitry coupled to the circuit node. The portion of the charge is reused during a second time period subsequent to the first time period. In one form a voltage generator has diode configurable transistors for passing current in only one direction depending upon whether the circuit node is being charged or discharged. In another form a switch couples the circuit node between a reference terminal and another circuit for charge reuse. Reuse of charge permits increased power savings.

19 Claims, 6 Drawing Sheets

METHOD AND CIRCUIT FOR CHARGING AND DISCHARGING A CIRCUIT NODE

BACKGROUND

1. Field

This disclosure relates generally to semiconductors, and more specifically, to voltage circuits used in semiconductors.

2. Related Art

Integrated circuits typically use charge pump circuits to boost a supply voltage to a value that is greater than the actual supply voltage value. Charge pumps are advantageous for creating a boost supply because they can be implemented in an integrated circuit. Many different types of charge pump circuits have been described to accomplish this function. In memory circuits, such as FLASH memory, a circuit node is charged to an elevated voltage. The circuit node is subsequently discharged. To discharge the circuit node a transistor or current source is connected to the circuit node to couple the circuit node to a ground voltage potential. The charge movement results in a current flow to discharge the boosted potential through the transistor or current source. The current flow is discharged to the ground terminal and all of the charge is lost as dissipated power. When integrated circuits include high capacitance nodes, the resulting power loss is substantial.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
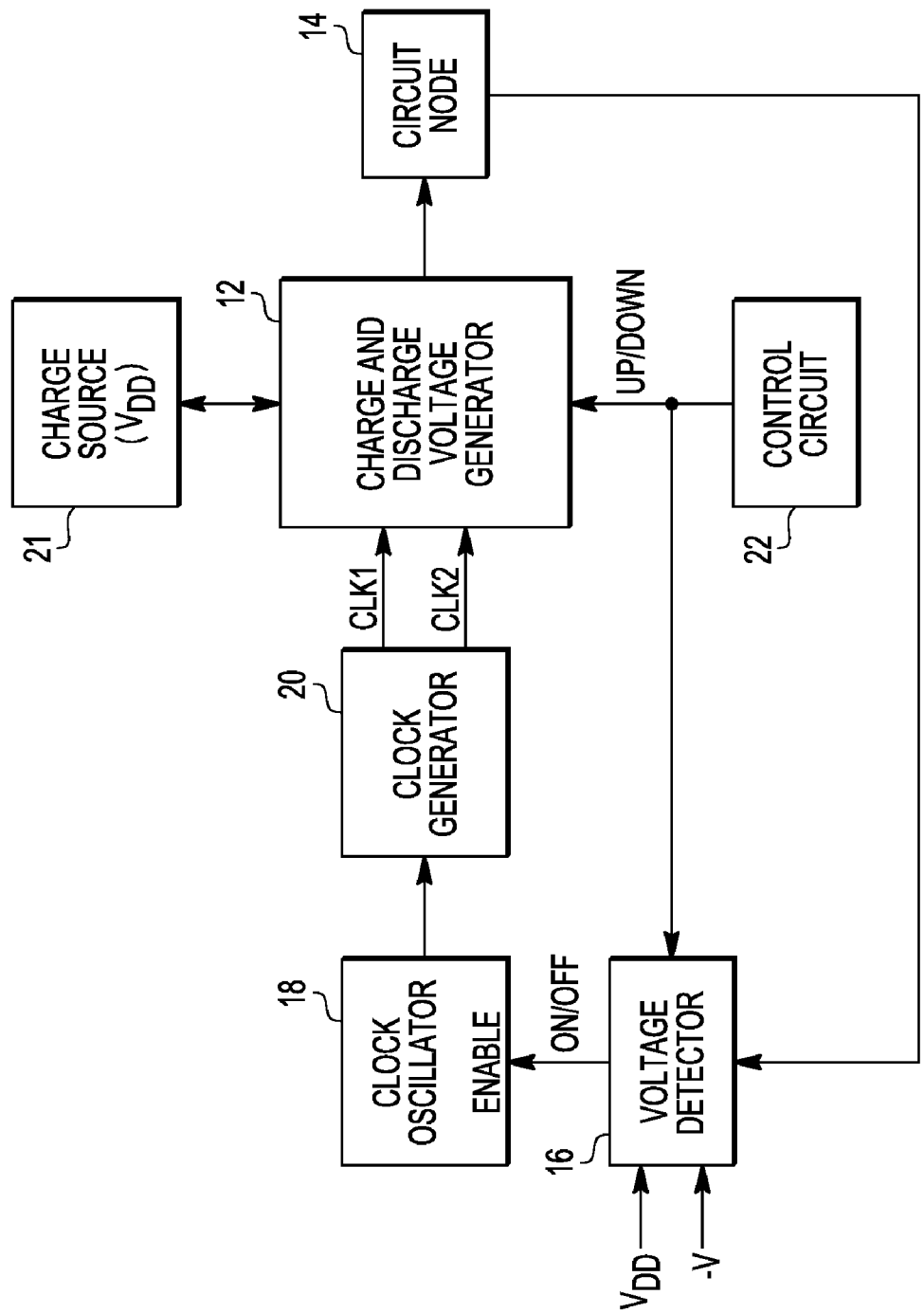
FIG. 1 illustrates in block diagram form a circuit for charging and discharging a circuit node in accordance with the present invention.

Illustrated in FIG. 1 is a circuit 10 for charging and discharging a circuit node 14 in a power efficient manner. Circuit 10 accomplishes the charging and discharging of circuit node 14 by reusing the charge of circuit node 14 by conserving a portion of the charge existing on circuit node 14. A clock oscillator 18 has an enable input for receiving an "On/Off" signal. The clock oscillator 18 has an output connected to an input of a clock generator 20. The clock oscillator 18 and clock generator 20 may be collectively considered as clock circuitry and implemented in a single circuit portion or as separate circuits as illustrated. A first output of clock generator 20 provides a first clock signal labeled "Clk 1" to a first input of a charge and discharge voltage generator 12, and a second output of clock generator 20 provides a second clock signal labeled "Clk 2" to a second input of the charge and discharge voltage generator 12. The charge and discharge voltage generator 12 functions as a charge pump circuit. An input/output terminal of the charge and discharge voltage generator 12 is connected to an input/output terminal of a charge source 21. In one form the charge source provides a supply voltage labeled $V_{DD}$. An output of the charge and discharge voltage generator 12 is connected to the circuit node 14. Circuit node 14 is a predetermined node within an integrated circuit or within a circuit system, such as a node of a printed circuit board or card. A first input of a voltage detector 16 is connected to the circuit node 14. A second input of voltage detector 16 receives a first voltage, such as the supply voltage $V_{DD}$. A third input of voltage detector 16 receives a second voltage, such as (−V), which is a negative voltage referenced to $V_{DD}$. An output of the voltage detector 16 provides an "On/Off" signal and is connected to an Enable input of the clock oscillator 18. A control circuit 22 has an output for providing an "Up/Down" signal. The output of control circuit 22 is connected to a third input of the charge and discharge voltage generator 12 and to a fourth input of voltage detector 16.

In operation, the charge source 21 bidirectionally sources charge to and sinks charge from the charge and discharge voltage generator 12 as the charge and discharge voltage generator 12 respectively charges circuit node 14 to a predetermined voltage and discharges circuit node 14 from the predetermined voltage returning charge to the charge source 21. As used herein the term "charge" is understood to mean the placing of a desired voltage, either positive or negative, on a circuit node or storage device. The term "discharge" is understood to mean the removing of a desired voltage, either positive or negative, on a circuit node or storage device. The voltage detector 16 that is coupled to circuit node 14 monitors the voltage potential at circuit node 14. Circuitry that is not shown determines when the circuit node 14 should be charged or discharged. Also, circuitry that is not shown is connected to the circuit node 14 to utilize the applied voltage to be maintained on the circuit node 14. In one form the circuit node 14 is a programming node of a FLASH memory. However, other applications of charge stored on a circuit node may be readily implemented. When circuit 10 is in a mode of operation wherein circuit node 14 is being charged to a predetermined voltage, such as −V, the control circuit 22 provides the up/down signal in a form that indicates that the voltage on circuit node 14 is to go down to the predetermined voltage. The voltage detector 16 is comparing the actual voltage at circuit node 14 with the −V that voltage detector 16 receives. When voltage detector 16 detects that the voltage on circuit node 14 is more than −V, voltage detector 16 provides an "on/off" signal to the enable input of the clock oscillator 18. The clock oscillator 18 provides a clock signal to the clock generator 20. The clock generator 20 uses the clock signal of the clock oscillator 18 and provides two clock signals, CLK1 and CLK2, in a phase relationship which is used as described below by the charge and discharge voltage generator 12 to enable the circuit node 14 to be charged by the charge source 21 to the beginning voltage ($V_{DD}$). The charge source 21 ($V_{DD}$) supplies charge from charge source 21 ($V_{DD}$) to the charge and discharge voltage generator 12 to charge circuit node 14 to −V and selectively permits charge from circuit node 14 to be returned to charge source 21 through the charge and discharge voltage generator 12 when the circuit node 14 is being charged back to $V_{DD}$. When circuit 10 is in a mode of operation required to discharge the circuit node 14 to a predetermined voltage such as (−V), control circuit 22 provides an encoded value of the up/down signal that indicates that the voltage on circuit node 14 is to go down. In response to the up/down signal, the voltage detector 16 provides an encoded value of the on/off signal that enables the clock oscillator 18. When voltage detector 16 determines that the circuit node 14 has achieved the target voltage (−V), it turns the clock oscillator 18 off which disables the charge and discharge voltage generator 12 by not providing the CLK1 and CLK2 signals. The lack of generation of the CLK1 and CLK2 signals has the effect of neither charging nor discharging the circuit node 14. When charging the circuit node 14 back to the beginning voltage ($V_{DD}$), circuit 10 operates in a similar fashion, but with the up/down signal encoded to indicate that the voltage on node 14 is to go up, and voltage detector 16 provides the on/off signal that enables the clock oscillator 18. When the voltage of node 14 reaches the beginning voltage ($V_{DD}$) the voltage detector 16 encodes the on/off signal to disable the clock oscillator 18. The operation of charge and discharge voltage generator 12 with respect to how charge on circuit node 14 is reused to save power may be further understood in connection with FIG. 2.

Figure 2:
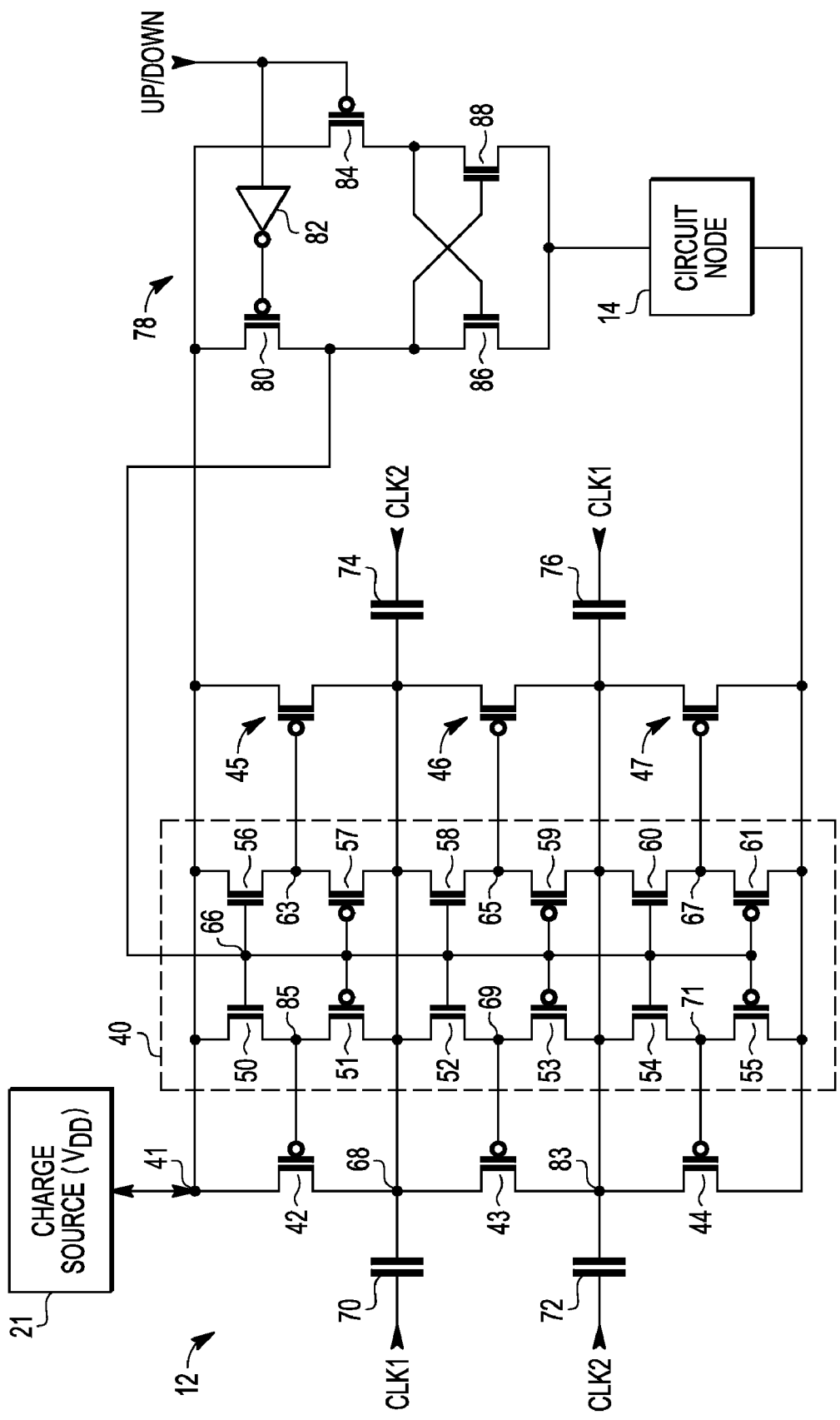
FIG. 2 illustrates in schematic form one embodiment of a charge and discharge voltage generator used in the circuit of FIG. 1.

Illustrated in FIG. 2 is an exemplary embodiment of the charge and discharge voltage generator 12 of FIG. 1 that is connected to the circuit node 14 and charge source 21. The charge source 21 is bidirectionally connected to a node 41. A diode-configurable P-channel transistor 42 has a source connected to the charge source 21 at node 41, a gate, and a drain connected to a node 68. A diode-configurable P-channel transistor 43 has a source connected to node 68, a gate, and a drain connected to a node 83. A diode-configurable P-channel transistor 44 has a source connected to node 83, a gate, and a drain connected to the circuit node 14. A diode-configurable P-channel transistor 45 has a source connected to the charge source 21 at node 41, a gate, and a drain connected to node 68. A diode-configurable P-channel transistor 46 has a source connected to node 68, a gate, and a drain connected to node 83. A diode-configurable P-channel transistor 47 has a source connected to node 83, a gate, and a drain connected to circuit node 14. The gates of diode-configurable transistors 42-47 are connected to a charge/discharge circuit 40. The charge/discharge circuit 40 has an N-channel transistor 50 having a drain connected to node 41, a gate, and a source connected to the gate of transistor 42 at a node 85. A P-channel transistor 51 has a source connected to the gate of transistor 42 at node 85, a gate, and a drain connected to node 68. An N-channel transistor 52 has a drain connected to node 68, a gate, and a source connected to the gate of transistor 43 at a node 69. A P-channel transistor 53 has a source connected to the gate of transistor 43 and the source of transistor 52, a gate, and a drain connected to node 83. An N-channel transistor 54 has a drain connected to node 83, a gate, and a source connected to the gate of transistor 44 at a node 71. A P-channel transistor 55 has a source connected to the source of transistor 54 and to the gate of transistor 44. Transistor 55 has a gate. A drain of transistor 55 is connected to the circuit node 14. An N-channel transistor 56 has a drain connected to node 41, a gate, and a source connected to the gate of transistor 45 at a node 63. A P-channel transistor 57 has a source connected to the gate of transistor 45 at node 63, a gate, and a drain connected to node 68. An N-channel transistor 58 has a drain connected to node 68, a gate, and a source connected to the gate of transistor 46 at a node 65. A P-channel transistor 59 has a source connected to the gate of transistor 46 and the source of transistor 58, a gate, and a drain connected to node 83. An N-channel transistor 60 has a drain connected to node 83, a gate, and a source connected to the gate of transistor 47 at a node 67. A P-channel transistor 61 has a source connected to the source of transistor 60 and to the gate of transistor 47. Transistor 61 has a gate. A drain of transistor 61 is connected to the circuit node 14. The gates of each of transistors 50-61 within the charge/discharge circuit 40 are connected together at a node 66. A first electrode of a capacitor 70 is connected to the first clock signal, CLK 1, provided by the clock generator 20. A second electrode of capacitor 70 is connected to node 68. A first electrode of a capacitor 72 is connected to the second clock signal, CLK 2, provided by the clock generator 20. A second electrode of capacitor 72 is connected to node 83. A first electrode of a capacitor 74 is connected to the second clock signal CLK 2. A second electrode of capacitor 74 is connected to node 68. A first electrode of capacitor 76 is connected to the first clock signal, CLK 1. A second electrode of capacitor 76 is connected to node 83.

Connected between the charge source 21 and the circuit node 14 is a voltage level shifter circuit 78. The voltage level shifter circuit 78 has a P-channel transistor 80 having a source connected to node 41, a gate, and a drain connected to node 66 of the charge/discharge circuit 40. An input of an inverter 82 is connected to receive the "Up/Down" signal provided by the control circuit 22 of FIG. 1. An output of inverter 82 is connected to the gate of transistor 80. A P-channel transistor 84 has a source connected to the source of transistor 80 at node 41, a gate for receiving the "Up/Down" signal, and a drain. An N-channel transistor 86 has a drain connected to the drain of transistor 80, a gate connected to the drain of transistor 84 and the drain of transistor 88, and a source connected to the circuit node 14. An N-channel transistor 88 has a drain connected to the drain of transistor 84, a gate connected to the drain of transistor 80 and the drain of transistor 86, and a source connected to the circuit node 14.

In operation, the charge/discharge circuit 40 selectively connects each of diode-configurable transistors 42-47 as a diode-configured transistor in response to the voltage at node 66 which is provided by the voltage level-shifter circuit 78. Depending upon whether the voltage at node 66 is a logic high or a logic low value determines whether the gate of each of diode-configurable transistors 42-47 is connected to its source or to its drain. For example, when the voltage level-shifter circuit 78 provides a logic high value at node 66, transistor 50 is conductive and transistor 51 is nonconductive to connect the source and gate of diode configurable transistor 42 together. Each of the remaining transistors 43-47 is similarly configured. In this configuration, charge is permitted to move only from circuit node 14 to charge source 21 through diode configurable transistors 44, 43 and 42 and through diode configurable transistors 47, 46 and 45. Any charge movement from charge source 21 to circuit node 14 is therefore blocked by the diode action of the diode configurable transistors 42-47. Similarly, when the voltage level-shifter circuit 78 provides a logic low value at node 66, transistor 50 is nonconductive and transistor 51 is conductive to connect the drain and gate of diode configurable transistor 42 together. Each of the remaining diode configurable transistors 43-47 is similarly configured. In this configuration, charge is permitted to move only from the charge source 21 to the circuit node 14 through diode configurable transistors 42, 43 and 44 and through diode configurable transistor 45, 46 and 47. Any charge flow from the circuit node 14 to the charge source 21 is blocked by the diode action of the diode configurable transistors 42-47.

The logic value of the voltage at node 66 is determined by the voltage level-shifter 78 in response to the value of the Up/Down signal that is provided by control circuit 22 of FIG. 1. When the circuit node 14 is determined to need to be charged toward $V_{DD}$, the effective logic value of the Up/Down signal is a logic low signal which makes transistor 80 nonconductive and transistor 84 conductive. When transistor 84 is conductive, the transistor 86 is conductive and transistor 88 is nonconductive. This biasing condition makes node 66 assume a logic low value which configures the diode-configurable transistors 42-47 to be able to only conduct current from the charge source 21 to the circuit node 14. The Clk1 and Clk2 signals are complementary phase clock signals. As noted above, when circuit node 41 is to be discharged toward $V_{DD}$, node 66 is low. During a clock phase when Clk1 is a logic low and Clk2 is a logic high, the capacitors 70 and 76 are initialized with charge from the diode-configurable transistors 42 and 47, respectively. During this phase the charge from capacitor 72 and capacitor 74 respectively moves through the diode-configurable transistors 43 and 45 in the direction of circuit node 41. As the clock signals change phase, capacitors 72 and 74 are charged through diode-configurable transistors 44 and 46 respectively and as the capacitors 70 and 76 are discharged through diode-configurable transistors 42 and 46, respectively. As the clocks continue to cycle, the charge on circuit node 41 moves through the diode-configurable transistors 42-47 in the direction of $V_{DD}$.

When the circuit node 14 is determined to need to be charged toward a negative voltage, the effective logic value of the Up/Down signal is a logic high signal which makes transistor 80 conductive and transistor 84 nonconductive. When transistor 84 is nonconductive, the transistor 86 is nonconductive and transistor 88 is conductive. This biasing condition makes node 66 assume a logic high value which configures the diode-configurable transistors 42-47 to be able to only conduct current from the circuit node 14 to the charge source 21. As the CLK1 and CLK2 clock signals cycle (i.e. oscillate), capacitors 70, 72, 74 and 76 charge and discharge in a similar fashion as described above wherein the charge on circuit node 41 moves through the charge and discharge voltage generator 12 toward $V_{DD}$ causing the voltage on node 41 to decrease.

Figure 3:
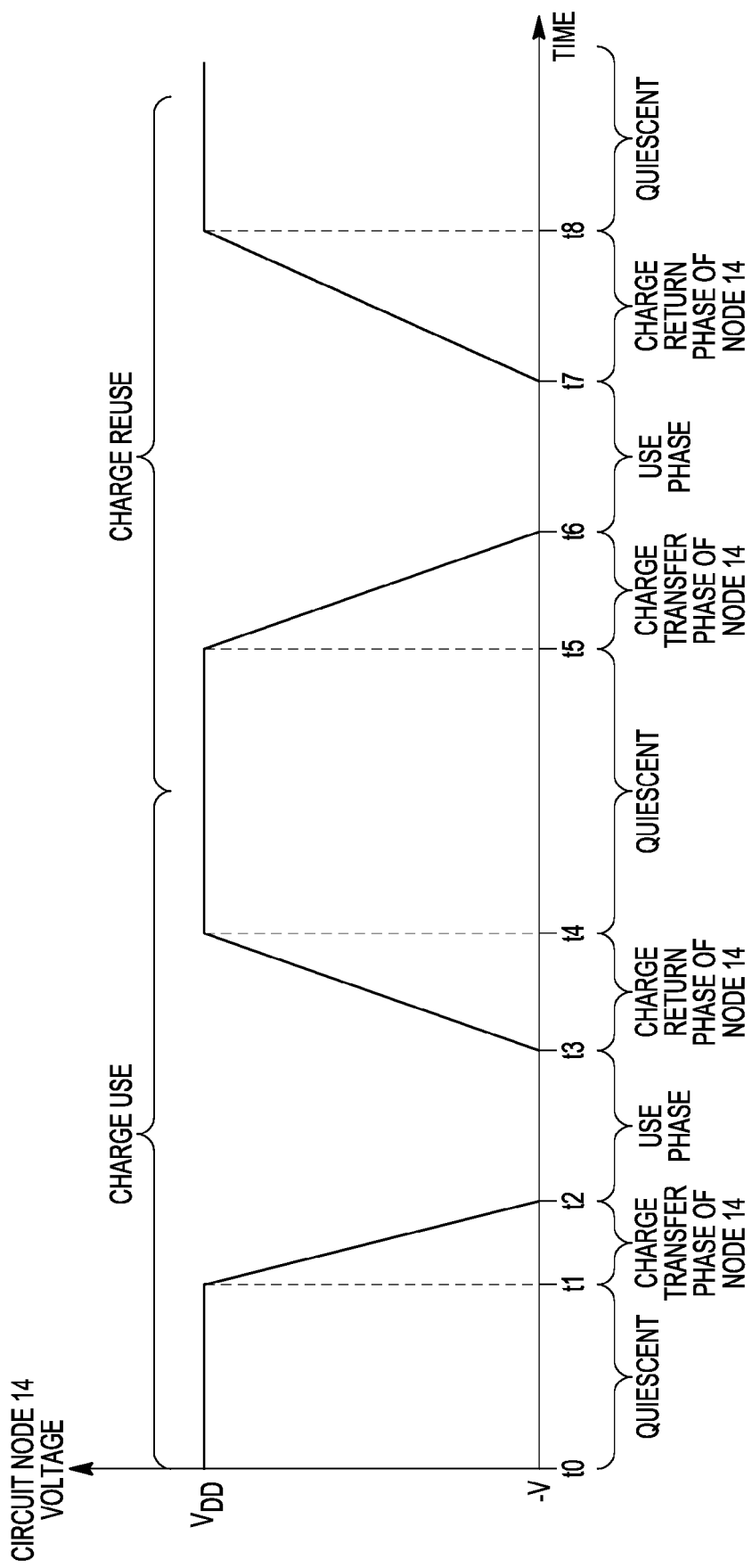
FIG. 3 illustrates in timing diagram form exemplary voltage variation of a circuit node during charge use and charge reuse operations.

Illustrated in FIG. 3 is an exemplary graph of the circuit node 14 voltage plotted as a function of time as the operation of circuit 10 occurs. In general, the graph illustrates both a charge use portion and a charge reuse portion in which power is significantly saved. Assume that circuit node 14 is initially charged to the $V_{DD}$ voltage potential from time t0 to time t1. The state of circuit node 14 is a quiescent state at this voltage potential. Within the system that uses circuit 10 a decision is made by circuitry (not shown) to discharge circuit node 14 to the voltage of (−V). As stated above, the (−V) voltage may be any predetermined voltage, either positive or negative or an isolated ground. Voltage node 14 is discharged to (−V) during the time interval from t1 to t2 during which charge transfer occurs with minimal power loss. The discharging occurs by returning charge from circuit node 14 to charge source 21. From time t2 to t3 the voltage (−V) at circuit node 14 is used by circuitry (not shown) in a use phase. From time t3 to t4 the circuit node 14 is returned to $V_{DD}$ in a charge return phase. At time t4 through time t5 the circuit node 14 is in a quiescent state. At time t5 the quiescent state ends and a charge transfer phase of circuit node 14 occurs by the charging of circuit node 14 to (−V) until time t6. During the time between t5 and t6 a substantial portion of the charge from the cycle embodied from t1 through t4 is reused. Between time t6 and time t7 a use phase occurs during which the (−V) voltage of circuit node 14 is used by circuitry (not shown). From time t7 to time t8 the charge from circuit node 14 is returned to the charge source 21 ($V_{DD}$) with minimal power loss for reuse in future cycles. The circuit node 14 is thereby discharged to $V_{DD}$. At time t8 the voltage of circuit node 14 is $V_{DD}$ and a quiescent state of circuit 10 resumes. The charge and discharge voltage generator 12 can be implemented in other forms than as illustrated in FIG. 2. For example, in some applications a charge and discharge generator that functions without diode voltage drop inefficiency, such as the voltage drops that exist across each of transistors 42-47, may be desirable. In such an alternative implementation a design which requires more clocking circuitry could be used. However, the additional clocking circuitry uses more circuit area so there is a design tradeoff between the use of additional area versus the use of power. In the illustrated embodiment of FIG. 2 a significant power savings is achieved in circuit operation with the reuse of charge as explained herein even though some power loss exists in connection with diode voltage drops.

Figure 4:
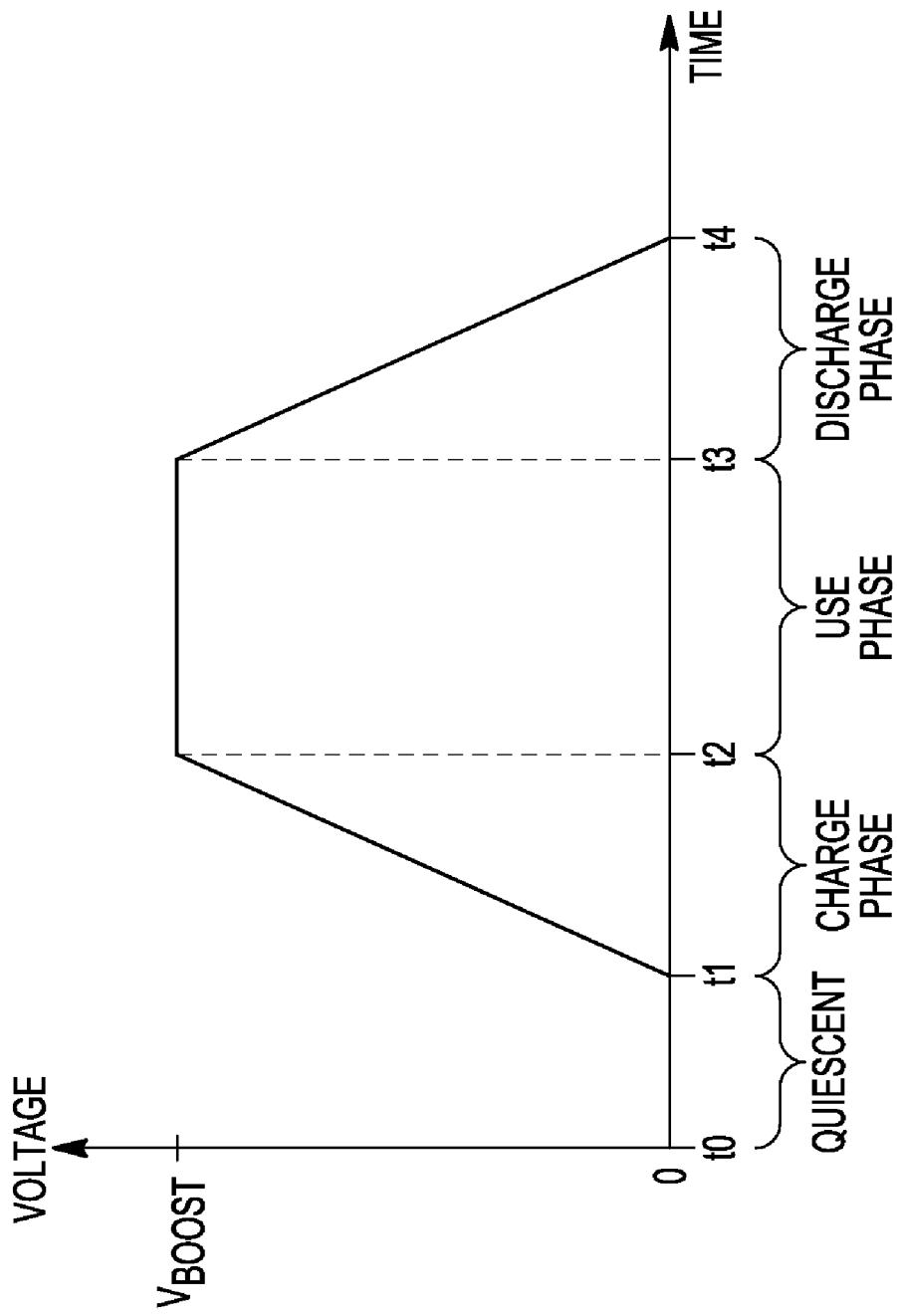
FIG. 4 illustrates in timing diagram form a known voltage variation of a circuit node during charge and discharge operations.

For comparison with FIG. 3, illustrated in FIG. 4 is a graphical timeline of the charging and discharging of a circuit node to a boosted voltage as commonly implemented. Assume the circuit node is at a ground zero voltage from time t0 through t1. The circuit node is in a quiescent state. At time t1 the voltage of the circuit node is boosted during a charge phase to a potential of $V_{Boost}$ until that voltage is reached at time t2. The $V_{Boost}$ voltage is used during a use phase from time t2 until time t3. Between time t3 and time t4 the circuit node is discharged through a power consuming resistive circuit element. At time t4 the voltage of the circuit node returns to zero volts. The conventional charging and discharging of a circuit node is wasteful of power. The discharged charge is not reused.

Figure 5:
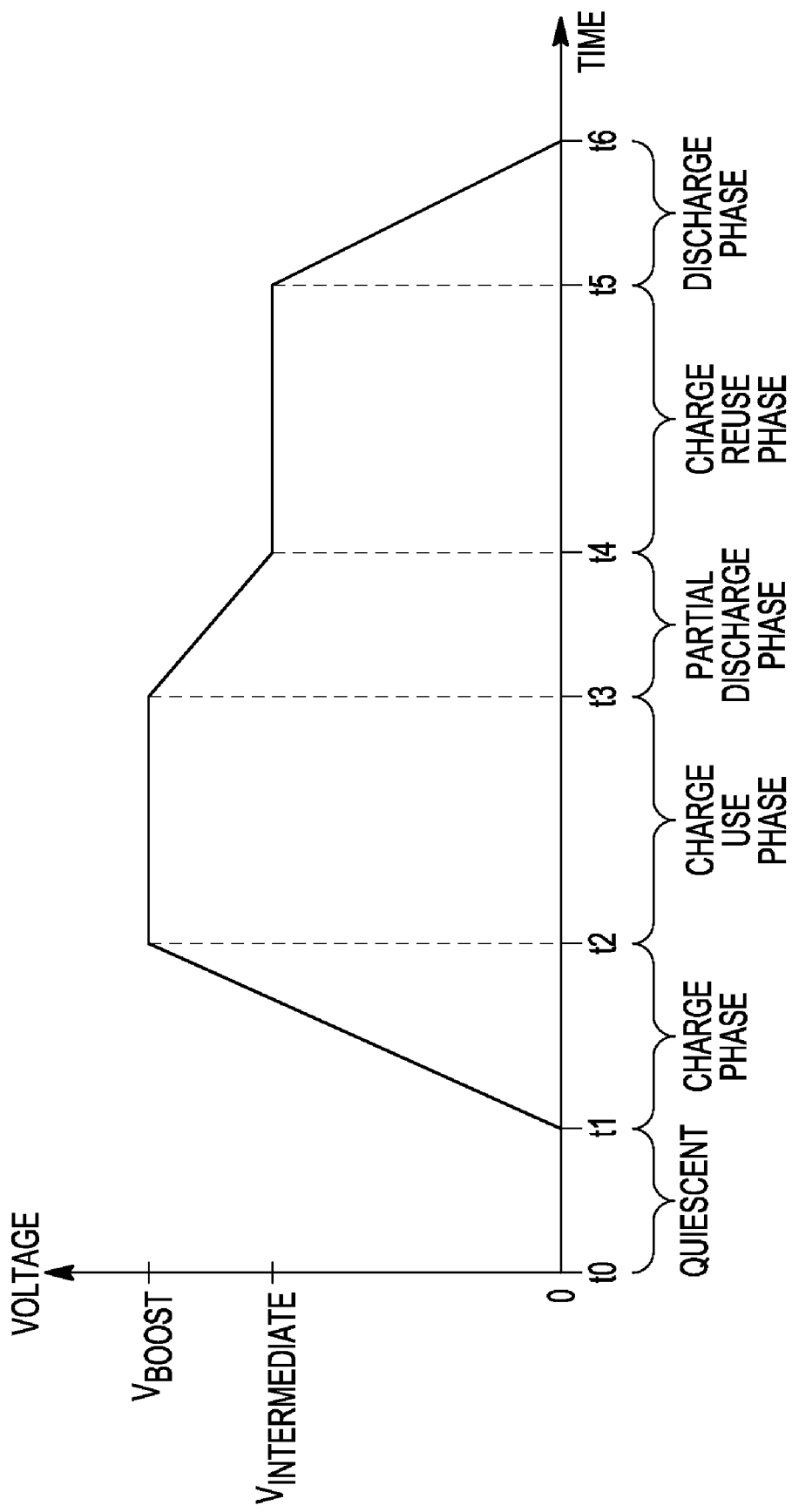
FIG. 5 illustrates in timing diagram form exemplary voltage variation of a circuit node during partial discharge and subsequent discharge phases.

Illustrated in FIG. 5 is a graph of another embodiment of the charging and discharging of a circuit node wherein a portion of the discharged potential is reused. In this form assume that between time t0 and t1 the circuit node is at zero volts potential and is in a quiescent state. Between time t1 and time t2 a charge phase occurs. The voltage of the circuit node is charged from zero volts to a predetermined voltage potential of $V_{Boost}$. The boosted voltage on the circuit node is used in a charge use phase between time t2 and time t3. Between time t3 and time t4 a partial discharge of the circuit node to an intermediate voltage, $V_{Intermediate}$, is made wherein the charge representing the voltage differential between $V_{Boost}$ and $V_{Intermediate}$ is transferred to another circuit node for reuse by circuit 108. The time period from time t4 to time t5 is a charge reuse phase wherein the charge transferred to support the $V_{Intermediate}$ voltage is reused. After the charge transfer from $V_{Boost}$ to $V_{Intermediate}$, a discharge phase is completed between time t5 and time t6 wherein the circuit node $V_{Boost}$ is discharged to ground or zero volts.

Figure 6:
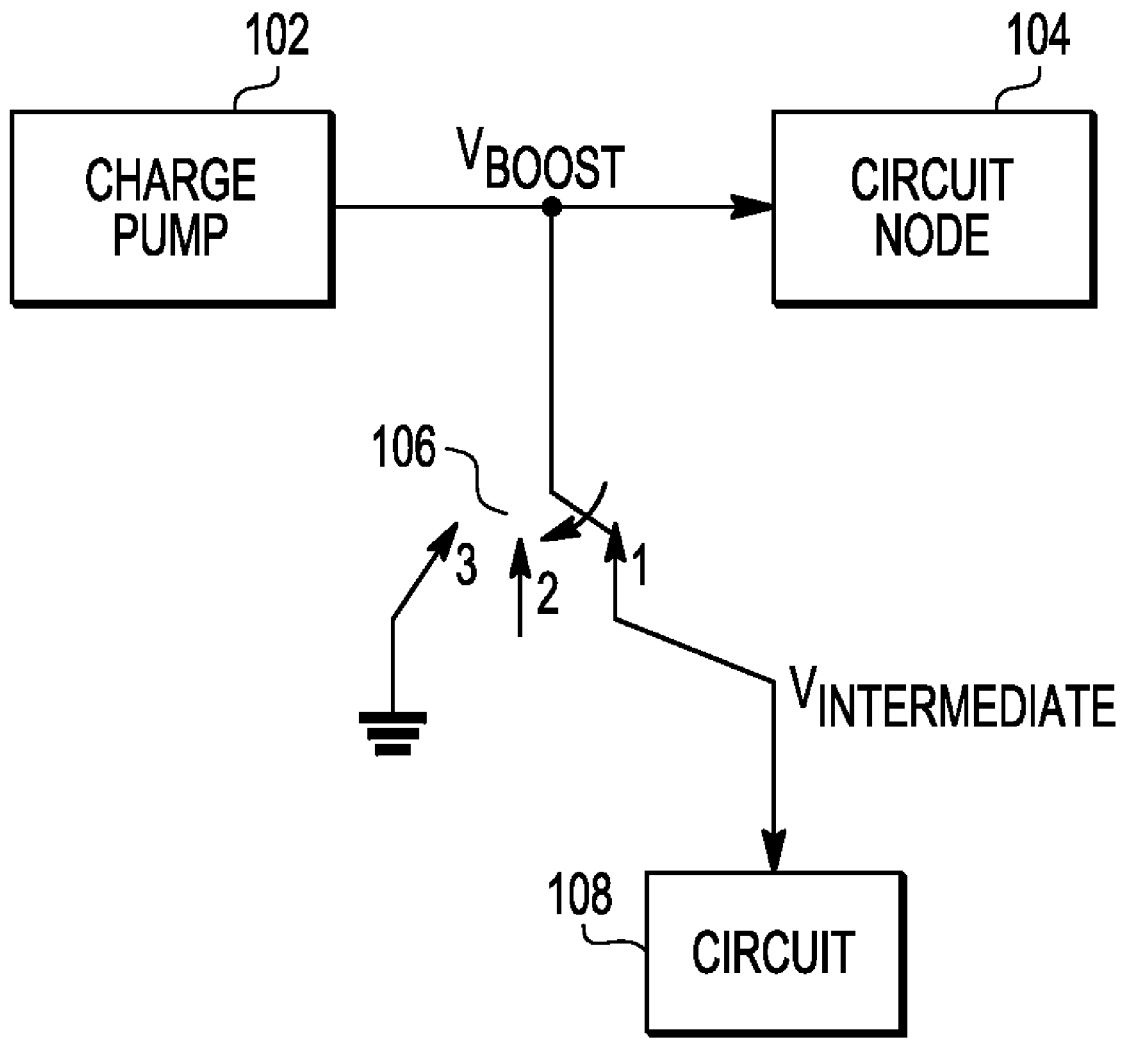
FIG. 6 illustrates in block diagram form a first embodiment of a voltage circuit for discharging a circuit node in two distinct discharge phases.

Illustrated in FIG. 6 is a first embodiment of a voltage circuit for implementing the voltage functionality represented in FIG. 5. A voltage circuit 100 is provided for discharging a node and reusing the charge by discharging in two phases. A charge pump 102 has an output terminal for providing a boosted voltage, $V_{Boost}$, which is elevated above a predetermined voltage such as a supply voltage. The output of the charge pump 102 is connected to a circuit node 104. A three-terminal switch 106 is connected to the circuit node 104. A first terminal of switch 106 is connected to a circuit 108 and transfers an amount of charge from the circuit node 104 to a node within circuit 108. A second terminal of switch 106 is not connected. A third terminal of switch 106 is connected to a ground reference voltage terminal or other voltage terminal which represents a voltage potential to which it is desired to discharge the circuit node 104. When switch 106 is connected to the second terminal the circuit node 104 is not connected to either circuit 108 or to the ground reference voltage terminal.

In operation, voltage circuit 100 uses the charge pump 102 to charge the circuit node 104 to the boosted voltage, $V_{Boost}$. During the charging of circuit node 104 the switch 106 is connected to the second position which is electrically floating in potential. The circuit node 104 may, for example, be a node of a memory circuit which is at a high voltage for programming a memory cell. At some point in time the circuit node 104 must be discharged. Rather than discharging the circuit node 104 to ground and losing the stored power, a portion of the charge associated with the potential difference $V_{Boost}$-$V_{Intermediate}$ as described in FIG. 5 is coupled to the circuit 108 by switching the switch 106 to the first position. The portion of the charge is thereby available for reuse by circuit 108. The circuit 108 is implemented as one of any of numerous types of circuits. For example, circuit 108 may be a logic circuit which has a static node for storing the $V_{Intermediate}$ voltage. After a charge associated with the $V_{Boost}$-$V_{Intermediate}$ voltage has been transferred from the circuit node 104 to the circuit 108, the remaining charge on circuit node 104 is discharged by switching the switch 106 to the third switch position. The third switch position of switch 106 connects the circuit node 104 to a ground potential which completes the discharge of the circuit node 104. The voltage circuit 100 has thus reused a significant portion of the charge which has been placed onto circuit node 104. It should be understood that charge pump 102 may be implemented using any of a variety of known charge pump circuit configurations.

By now it should be appreciated that there has been provided a voltage circuit for charging a circuit node and discharging at least a portion of the charge for subsequent reuse to thereby save power. In one form a charge pump is used which is power efficient as the charge pump transfers charge rather than discharging the charge to ground through a resistive circuit element. In one form the reused charge is transferred back into a charge source, such as a power supply. In that form substantially all of the reused charge is transferred back to the charge source. In another form the reused charge is transferred to another circuit node of a separate circuit. In that form less than all of the original charge is reused by the separate circuit. In one form a charge pump is used to transfer charge to a circuit node and again transfer the charge for subsequent reuse. The polarity of the charge pump is bidirectional and may be reversed by using transistor switches to reconfigure series-connected transistors as diodes which conduct current in only one direction. Depending upon the direction of charge flow, the charge/discharge circuit 40 determines what diode configuration the series-connected transistors will assume. Capacitors within the charge pump are clocked by two complementary phase clock signals to efficiently move charge through the charge pump without incurring any significant power loss. Thus the voltage circuits described herein are very power efficient.

There is provided in one form a method of charging a circuit node to a first predetermined voltage. The first predetermined voltage charged onto the circuit node is used for a first predetermined function during a first time period. A portion of charge is removed from the circuit node to circuitry coupled to the circuit node. The portion of the charge is reused during a second time period subsequent to the first time period. In another form the circuit node is charged via a charge pump circuit. The portion of the charge is removed by coupling the circuit node through the charge pump circuit to a charge source. In another form the charge pump circuit is configured to charge the circuit node. The portion of the charge is removed by using a plurality of series-coupled diode configurable transistors which are configured to conduct current in a first direction when charging the circuit node and configured to conduct current in a second direction opposite the first direction when removing the portion of the charge. In another form the portion of the charge is removed from the circuit node by initially removing less than all of the charge from the circuit node. The less than all of the charge is coupled to the circuitry coupled to the circuit node for reuse by the circuitry. A remainder of the charge from the circuit node is subsequently removed to discharge the circuit node to a second predetermined voltage. In yet another form a multiple position switch is coupled to the circuit node. The circuitry is coupled to the switch for selectively receiving the portion of charge that is removed from the circuit node via the multiple position switch. In another form a charge source is provided as the circuitry. The charge source is coupled to the circuit node via a bidirectional charge pump comprising series-connected diode-configurable transistors which configure a current direction of the diode-configurable transistors based upon a desired direction of charge movement in the charge pump. In another form a voltage value is detected at the circuit node. A clock oscillator is selectively enabled in response to said detecting by comparing a detected voltage with a value of the first predetermined voltage and determining that the voltage value at the circuit node needs to be increased. The clock oscillator is used to operate a charge pump circuit. The circuit node is charged via the charge pump circuit.

In another form there is provided a voltage circuit having a circuit node and a charge source for providing charge to be stored onto the circuit node. A voltage generator is coupled between the circuit node and the charge source. The voltage generator conducts current in a first direction to charge a first predetermined voltage onto the circuit node for use in a first predetermined function during a first time period. The voltage generator removes a portion of the charge from the circuit node by conducting current in a second direction opposite the first direction and couples the portion to the charge source for reuse by the charge source during a second time period subsequent to the first time period with minimal power loss from not discharging the portion of the charge to ground. In one form a control circuit is coupled to the voltage generator for providing a control signal indicating whether the circuit node should be charged or discharged. A voltage detector is coupled to the circuit node and the control circuit for comparing voltage at the circuit node with either the first predetermined voltage or a second predetermined voltage in response to the control signal, the voltage detector providing a clock enable signal. Clock circuitry is coupled to the voltage generator and the voltage detector for providing one or more clock signals in response to the clock enable signal. The one or more clock signals transfer charge through the voltage generator between the charge source and the circuit node. In another form the voltage generator switches diode-configurable transistors in response to the control signal to enable current to flow in only one direction through the voltage generator. In another form the voltage generator has a plurality of series-coupled transistors coupled between the charge source and the circuit node, each having a source, a drain and a control electrode. A charge/discharge switch is coupled to the control electrode of each of the plurality of series-coupled transistors. The charge/discharge switch selectively connects the control electrode to a corresponding drain or a corresponding source of each of the plurality of series-coupled transistors in response to the control signal. In another form the voltage generator has a voltage level shifting circuit coupled to the circuit node. The voltage level shifting circuit has an input for receiving the control signal and has an output coupled to the charge/discharge circuit for configuring the charge/discharge circuit to either charge the circuit node or discharge the circuit node. In one form the charge/discharge circuit has a plurality of pairs of complementary conductivity transistors, each pair being coupled in series and coupled to a source and a drain of a respective one of the plurality of series-coupled transistors and to a control electrode thereof at a common connection between the each pair, wherein only one transistor of each pair is conductive to place the respective one of the plurality of series-coupled transistors in a diode configuration. In another form a control circuit is coupled to the voltage generator for providing a control signal indicating whether the circuit node should be charged or discharged. A voltage detector is coupled to the circuit node and the control circuit for comparing voltage at the circuit node with either the first predetermined voltage or a second predetermined voltage in response to the control signal. The voltage detector provides a clock enable signal. A clock oscillator has an input coupled to the voltage detector for receiving the clock enable signal and has an output for providing an oscillating clock in response to the clock enable signal. A clock generator has an input coupled to the output of the clock oscillator, a first output coupled to the voltage generator for providing a first clock signal, and a second output coupled to the voltage detector for providing a second clock signal. The first clock signal and the second clock signal transfer charge through the voltage generator between the charge source and the circuit node. In another form the voltage generator has a plurality of series-coupled transistors coupled between the charge source and the circuit node, each having a source, a drain and a control electrode. A charge/discharge circuit is coupled to the control electrode of each of the plurality of series-coupled transistors. The charge/discharge circuit selectively connects each control electrode of the series-coupled transistors to a corresponding drain or a corresponding source in response to the control signal to determine a current flow direction through the voltage generator.

In another form there is provided a voltage circuit having a circuit node and a first charge pump coupled to the circuit node. The first charge pump provides charge to be stored onto the circuit node. The first charge pump charges a first predetermined voltage onto the circuit node for use in a first predetermined function during a first time period. A multiple position switch is coupled to the circuit node. A circuit for implementing a predetermined function is coupled to the multiple position switch. The circuit receives a portion of charge from the circuit node for reuse by the circuit during a second time period subsequent to the first time period. The multiple position switch discharges the circuit node to a second predetermined voltage subsequent to the circuit receiving the portion of charge from the circuit node. In another form the charge pump conducts current to charge the first predetermined voltage onto the circuit node during a first time period. The multiple position switch removes the portion of the charge from the circuit node for reuse by the circuit during a second time period subsequent to the first time period with minimal power loss from not discharging the first predetermined voltage to ground. In another form the multiple position switch further has a first terminal coupled to the circuit for implementing the predetermined function, a second terminal that is electrically floating, and a third terminal coupled to a reference voltage terminal. In yet another form the circuit for implementing the predetermined function is a logic circuit having a static node for receiving the portion of charge from the circuit node for reuse. In yet another form the first predetermined voltage is an intermediate voltage which has a voltage magnitude that is intermediate the first predetermined voltage and a ground reference.

Although the invention has been described with respect to specific conductivity types or polarity of potentials, skilled artisans appreciated that conductivity types and polarities of potentials may be reversed. Moreover, terms such as "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the circuit node for storing charge may be implemented in various types of transistor memory storage cell circuits and various types of memory, such as Flash, DRAM, SRAM and MRAM (magnetoresistive random access memory). Various logic circuits or logic gates that implement digital logic functions may be implemented to perform the described functionality of circuit 108 and circuit 116. Switch 106 and switch 113 may be implemented with any of a variety of differing switch circuits including, but not limited to, any type of switch using transistors. In the voltage circuit 109 all or some of the illustrated charge pumps may be implemented with the same charge pump circuitry which is time shared. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
    charging a circuit node to a first predetermined voltage via a charge pump circuit;
    using the first predetermined voltage charged onto the circuit node for a first predetermined function during a first time period;
    removing a portion of charge from the circuit node to circuitry coupled to the circuit node by coupling the circuit node through the charge pump circuit to a charge source; and
    reusing the portion of the charge during a second time period subsequent to the first time period.

2. The method of claim 1 further comprising:
    configuring the charge pump circuit to charge the circuit node and removing the portion of the charge by using a plurality of series-coupled diode configurable transistors which are configured to conduct current in a first direction when charging the circuit node and configured to conduct current in a second direction opposite the first direction when removing the portion of the charge.

3. The method of claim 1 further comprising:
removing the portion of the charge from the circuit node by initially removing less than all of the charge from the circuit node;
coupling the less than all of the charge to the circuitry coupled to the circuit node for reuse by the circuitry; and
subsequently removing a remainder of the charge from the circuit node to discharge the circuit node to a second predetermined voltage.

4. The method of claim 3 further comprising:
coupling a multiple position switch to the circuit node; and
coupling the circuitry to the switch for selectively receiving the portion of charge that is removed from the circuit node via the multiple position switch.

5. The method of claim 1 further comprising:
providing a charge source as the circuitry; and
coupling the charge source to the circuit node via a bidirectional charge pump comprising series-connected diode-configurable transistors which configure a current direction of the diode-configurable transistors based upon a desired direction of charge movement in the charge pump.

6. The method of claim 1 further comprising:
detecting a voltage value at the circuit node;
selectively enabling a clock oscillator in response to said detecting by comparing a detected voltage with a value of the first predetermined voltage and determining that the voltage value at the circuit node needs to be increased;
using the clock oscillator to operate a charge pump circuit; and
charging the circuit node via the charge pump circuit.

7. A voltage circuit comprising:
a circuit node;
a charge source for providing charge to be stored onto the circuit node; and
a voltage generator coupled between the circuit node and the charge source, the voltage generator conducting current in a first direction to charge a first predetermined voltage onto the circuit node for use in a first predetermined function during a first time period, the voltage generator removing a portion of the charge from the circuit node by conducting current in a second direction opposite the first direction and coupling the portion to the charge source for reuse by the charge source during a second time period subsequent to the first time period with minimal power loss from not discharging the portion of the charge to ground.

8. The voltage circuit of claim 7 further comprising:
a control circuit coupled to the voltage generator for providing a control signal indicating whether the circuit node should be charged or discharged;
a voltage detector coupled to the circuit node and the control circuit for comparing voltage at the circuit node with either the first predetermined voltage or a second predetermined voltage in response to the control signal, the voltage detector providing a clock enable signal; and
clock circuitry coupled to the voltage generator and the voltage detector for providing one or more clock signals in response to the clock enable signal, the one or more clock signals transferring charge through the voltage generator between the charge source and the circuit node.

9. The voltage circuit of claim 8 wherein the voltage generator switches diode-configurable transistors in response to the control signal to enable current to flow in only one direction through the voltage generator.

10. The voltage circuit of claim 8 wherein the voltage generator further comprises:
a plurality of series-coupled transistors coupled between the charge source and the circuit node, each having a source, a drain and a control electrode; and
a charge/discharge switch coupled to the control electrode of each of the plurality of series-coupled transistors, the charge/discharge switch selectively connecting the control electrode to a corresponding drain or a corresponding source of each of the plurality of series-coupled transistors in response to the control signal.

11. The voltage circuit of claim 10 wherein the voltage generator further comprises:
a voltage level shifting circuit coupled to the circuit node and having an input for receiving the control signal and an output coupled to the charge/discharge switch for configuring the charge/discharge switch to either charge the circuit node or discharge the circuit node.

12. The voltage circuit of claim 10 wherein the charge/discharge switch further comprises:
a plurality of pairs of complementary conductivity transistors, each of the plurality of pairs being coupled in series and coupled to a source and a drain of a respective one of the plurality of series-coupled transistors and to a control electrode thereof at a common connection between the each of the plurality of pairs, wherein only one transistor of each pair is conductive to place the respective one of the plurality of series-coupled transistors in a diode configuration.

13. The voltage circuit of claim 7 further comprising:
a control circuit coupled to the voltage generator for providing a control signal indicating whether the circuit node should be charged or discharged;
a voltage detector coupled to the circuit node and the control circuit for comparing voltage at the circuit node with either the first predetermined voltage or a second predetermined voltage in response to the control signal, the voltage detector providing a clock enable signal;
a clock oscillator having an input coupled to the voltage detector for receiving the clock enable signal and having an output for providing an oscillating clock in response to the clock enable signal; and
a clock generator having an input coupled to the output of the clock oscillator, a first output coupled to the voltage generator for providing a first clock signal, and a second output coupled to the voltage detector for providing a second clock signal, the first clock signal and the second clock signal transferring charge through the voltage generator between the charge source and the circuit node.

14. The voltage circuit of claim 13 wherein the voltage generator further comprises:
a plurality of series-coupled transistors coupled between the charge source and the circuit node, each having a source, a drain and a control electrode; and
a charge/discharge circuit coupled to the control electrode of each of the plurality of series-coupled transistors, the charge/discharge circuit selectively connecting each control electrode of the plurality of series-coupled transistors to a corresponding drain or a corresponding source in response to the control signal to determine a current flow direction through the voltage generator.

15. A voltage circuit comprising:
a circuit node;

a charge pump coupled to the circuit node for providing charge to be stored onto the circuit node, the charge pump charging a first predetermined voltage onto the circuit node for use in a first predetermined function during a first time period;

a multiple position switch coupled to the circuit node; and a circuit for implementing a predetermined function coupled to the multiple position switch, the circuit receiving a portion of charge from the circuit node for reuse by the circuit during a second time period subsequent to the first time period, the multiple position switch discharging the circuit node to a second predetermined voltage subsequent to the circuit receiving the portion of charge from the circuit node.

16. The voltage circuit of claim 15 wherein the charge pump conducts current to charge the first predetermined voltage onto the circuit node during a first time period, the multiple position switch removing the portion of the charge from the circuit node for reuse by the circuit during a second time period subsequent to the first time period with minimal power loss from not discharging the first predetermined voltage to ground.

17. The voltage circuit of claim 15 wherein the multiple position switch further comprises a first terminal coupled to the circuit for implementing the predetermined function, a second terminal that is electrically floating, and a third terminal coupled to a reference voltage terminal.

18. The voltage circuit of claim 17 wherein the circuit for implementing the predetermined function comprises a logic circuit having a static node for receiving the portion of charge from the circuit node for reuse.

19. The voltage circuit of claim 15 wherein the first predetermined voltage is an intermediate voltage which has a voltage magnitude that is intermediate the first predetermined voltage and a ground reference.

\* \* \* \* \*